(12) United States Patent
Miyao

(10) Patent No.: US 8,778,739 B2
(45) Date of Patent: Jul. 15, 2014

(54) LEAD FRAME AND METHOD OF MANUFACTURING THE SAME, AND SEMICONDUCTOR DEVICE AND METHOD OF MANUFACTURING THE SAME

(71) Applicant: Shinko Electric Industries Co., Ltd., Nagano (JP)

(72) Inventor: Hitoshi Miyao, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 13/751,609

(22) Filed: Jan. 28, 2013

(65) Prior Publication Data

US 2013/0193567 A1  Aug. 1, 2013

(30) Foreign Application Priority Data

Jan. 31, 2012  (JP) ................................ 2012-018461

(51) Int. Cl.
  *H01L 33/62* (2010.01)
  *H01L 23/495* (2006.01)
  *H01L 21/50* (2006.01)

(52) U.S. Cl.
  USPC .............. 438/123; 438/51; 438/64; 438/106; 438/121; 257/666; 257/667; 257/669; 257/674; 257/676; 257/E23.031; 257/E23.043; 257/E23.045

(58) Field of Classification Search
  USPC ........... 438/51, 64, 106, 121, 123, FOR. 366, 438/FOR. 377, FOR. 380; 257/666, 667, 257/669, 674, 676, E23.031, E23.043, 257/E23.045
  See application file for complete search history.

(56) References Cited

U.S. PATENT DOCUMENTS

| 7,109,570 | B2 * | 9/2006 | Manalac et al. | 257/666 |
| 8,310,042 | B2 | 11/2012 | Elliott et al. | |
| 2009/0115030 | A1 * | 5/2009 | Ajmera et al. | 257/632 |
| 2009/0256247 | A1 * | 10/2009 | Landau et al. | 257/676 |

FOREIGN PATENT DOCUMENTS

| JP | H7-161896 | 6/1995 |
| JP | H7-273270 | 10/1995 |
| JP | 2009-260282 A1 | 11/2009 |

* cited by examiner

*Primary Examiner* — Thanh V Pham

(74) *Attorney, Agent, or Firm* — Kratz, Quintos & Hanson, LLP

(57) ABSTRACT

A method of manufacturing a lead frame, includes forming a rectangular first dimple includes, first inclined side surfaces inclined to a depth direction, and arranged in two opposing sides in one direction, and standing side surfaces standing upright to a depth direction, and arranged in two opposing sides in other direction, on a backside of a die pad by a first stamping, and forming a second dimple having second inclined side surfaces inclined on the backside of the die pad by a second stamping, such that a second inclined side surfaces of the second dimple are arranged in side areas of the standing side surfaces of the first dimple, wherein the standing side surfaces are transformed into reversed inclined side surfaces inclined to a reversed direction to the first inclined side surfaces, and a front side of the die pad is semiconductor element mounting surface.

10 Claims, 15 Drawing Sheets

LEAD FRAME AND METHOD OF MANUFACTURING THE SAME, AND SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2012-018461, filed on Jan. 31, 2012, the entire contents of which are incorporated herein by reference.

FIELD

It is related to a lead frame and a method of manufacturing the same, and a semiconductor device and a method of manufacturing the same.

BACKGROUND

In the prior art, in the semiconductor packages using the lead frames, there is the semiconductor package having a structure in which the semiconductor element is mounted on the die pad, and the semiconductor element and a plurality of leads are connected via a wire respectively, and both surfaces of the die pad, the semiconductor element, and respective wires are sealed with a sealing resin.

In such semiconductor package, in order to improve adhesion of the sealing resin on the backside of the die pad, a large number of dimples are provided on the backside of the die pad. The dimples provided on the backside of the die pad are formed in a shape such as a quadrangular pyramid, or the like by the stamping. Consequently, adhesion of the sealing resin on the backside of the die pad is not always sufficient.

A related art is disclosed in Japanese Laid-open Patent Publication No. 07-161896, Japanese Laid-open Patent Publication No. 07-273270, and Japanese Laid-open Patent Publication No. 2009-260282.

SUMMARY

According to one aspect discussed herein, there is provided a method of manufacturing a lead frame, which includes forming a rectangular first dimple includes, first inclined side surfaces inclined to a depth direction, and arranged in two opposing sides in one direction, and standing side surfaces standing upright to a depth direction, and arranged in two opposing sides in other direction, on a backside of a die pad by a first stamping, and forming a second dimple including second inclined side surfaces inclined to a depth direction on the backside of the die pad by a second stamping, such that the second inclined side surfaces of the second dimple are arranged in side areas of the standing side surfaces of the first dimple, wherein in the forming the second dimple, the standing side surfaces of the first dimple are transformed into reversed inclined side surfaces inclined to a reversed direction to the first inclined side surfaces, and a front side of the die pad is semiconductor element mounting surface.

Also, according to another aspect discussed herein, there is provided a lead frame, which includes a die pad, a rectangular first dimple formed on a backside of the die pad, including, first inclined side surfaces inclined to a depth direction, and arranged in two opposing sides in one direction, and reversed inclined side surfaces inclined to a reversed direction to the first inclined side surfaces, and arranged in two opposing sides in other direction, and a second dimple formed on the backside of the die pad in side areas of the first dimple, and including second inclined side surfaces inclined to a depth direction, and the second inclined side surfaces being arranged to oppose to the reversed inclined side surfaces of the first dimple, wherein a front side of the die pad is a semiconductor element mounting surface.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Embodiments will be explained with reference to the accompanying drawings hereinafter.

(First Embodiment)

Figure 4:
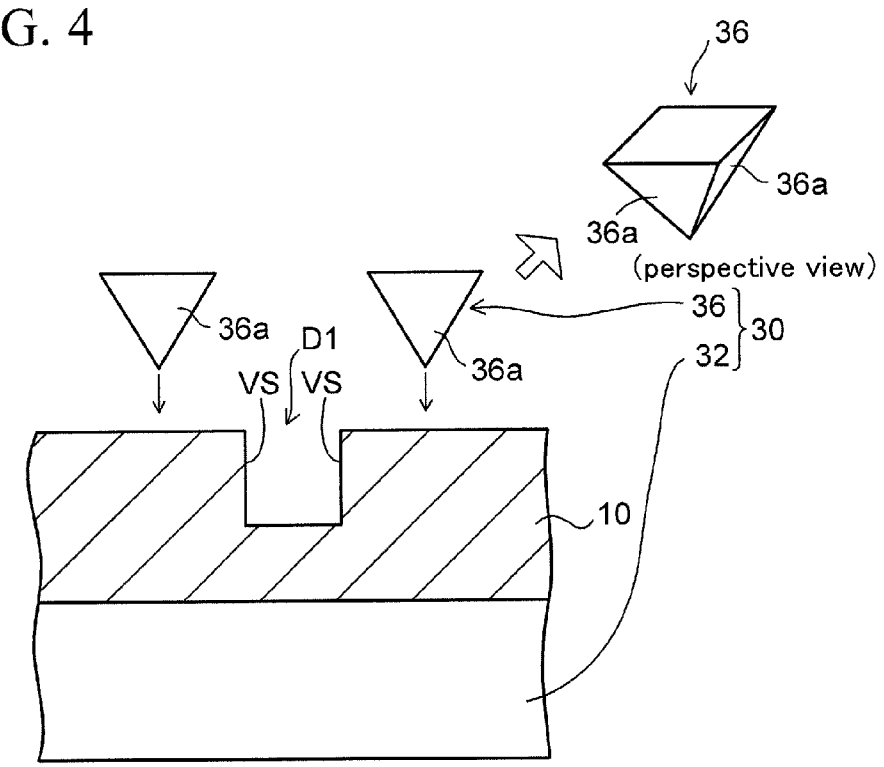
FIG. 4 is a sectional view and a perspective view (#4) depicting the method of manufacturing the lead frame according to the first embodiment.
Figure 5A:
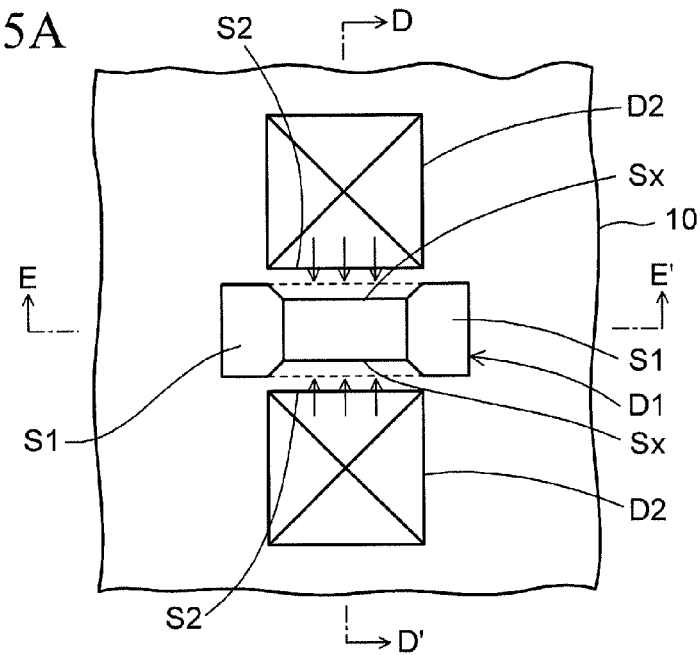
FIGS. 5A to 5C are a plan view and sectional views (#5) depicting the method of manufacturing the lead frame according to the first embodiment.
Figure 5B:
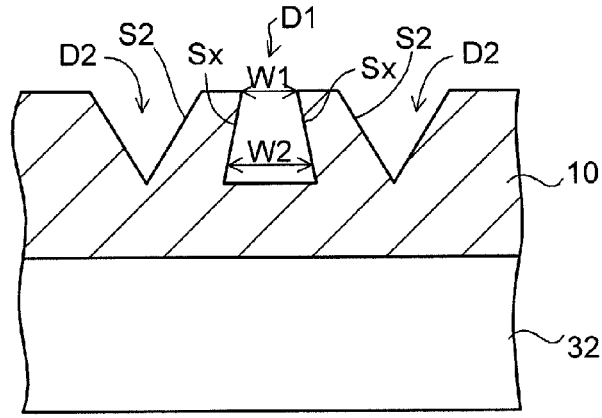
Figure 5C:
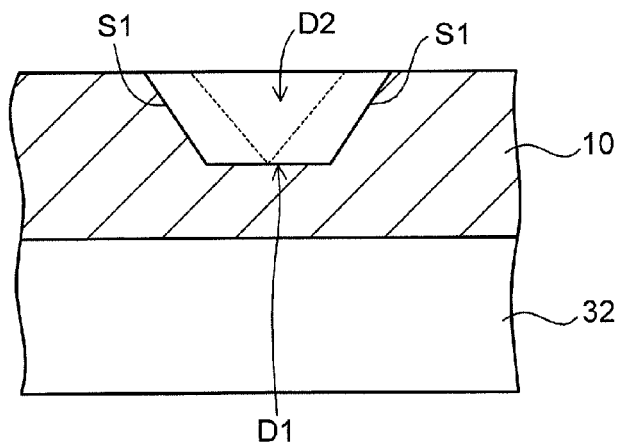
Figure 6:
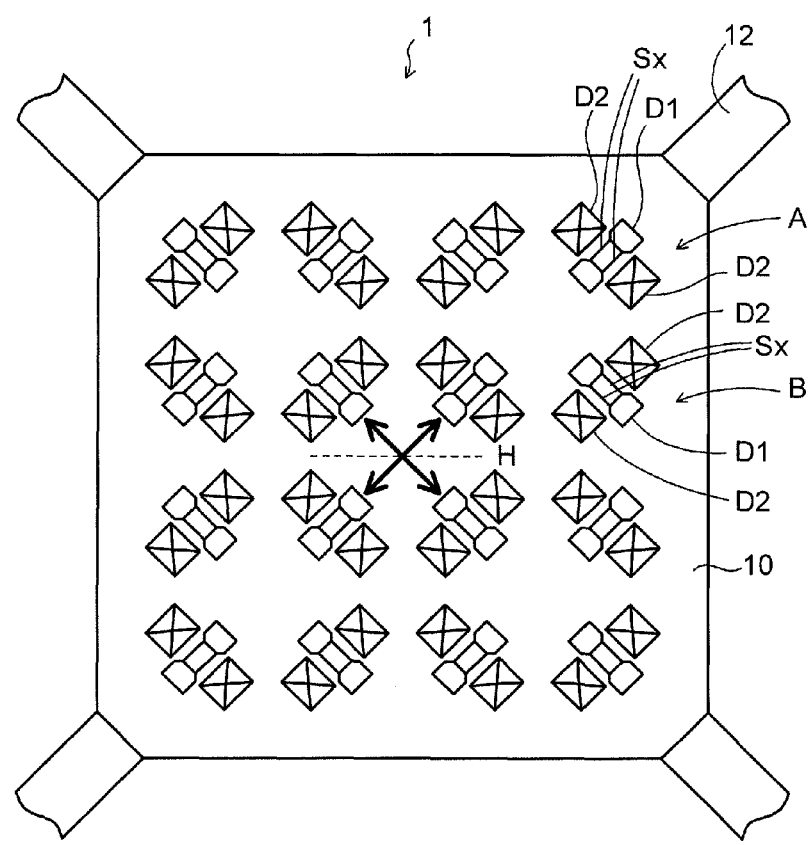
FIG. 6 is a plan view depicting a lead frame according to the first embodiment.

FIG. 1A to FIG. 5C are views depicting a method of manufacturing a lead frame according to a first embodiment, and FIG. 6 is a view depicting a lead frame according to the first embodiment.

Figure 1A:
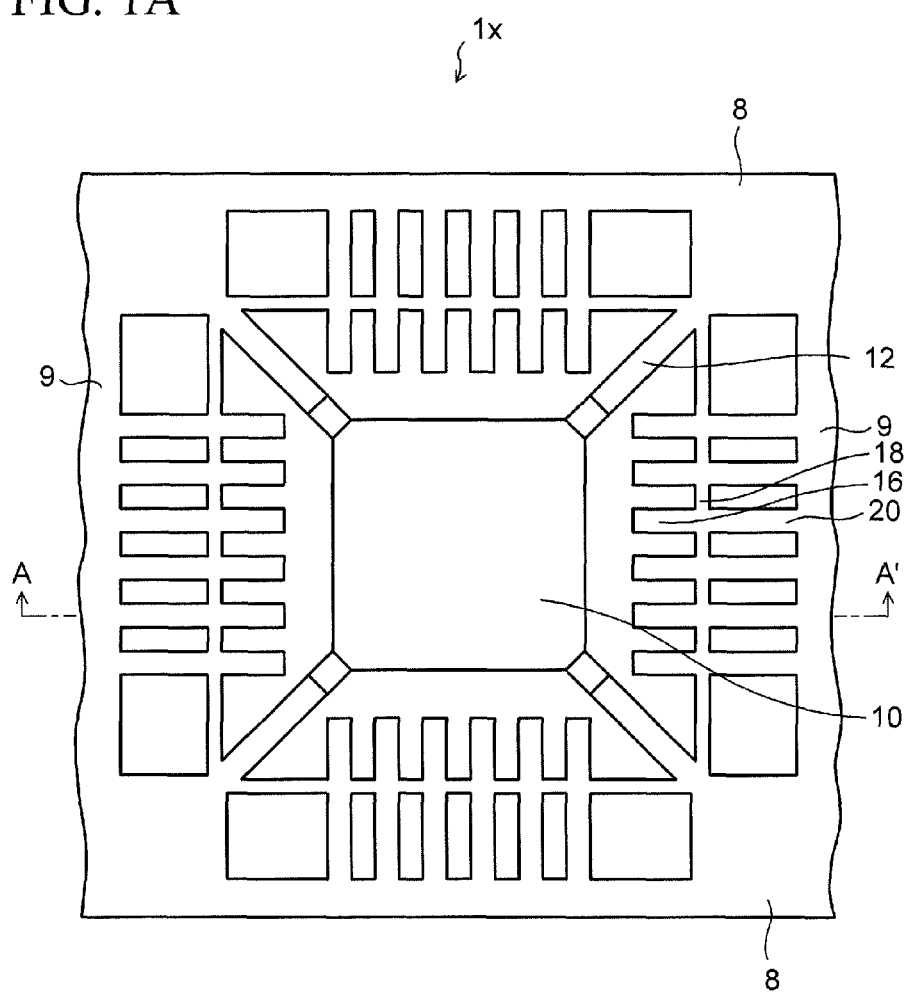
FIGS. 1A and 1B are a plan view and a sectional view (#1) depicting a method of manufacturing a lead frame according to a first embodiment.

In the method of manufacturing the lead frame of the first embodiment, first, a lead frame member 1x depicted in a plan view of FIG. 1A is prepared. The lead frame member 1x includes a frame structure that is formed by a pair of outer frames 8 extending in parallel, and a pair of inner frames 9 coupled to this pair of outer frames 8 to intersect orthogonally with them.

A quadrangular die pad 10 is arranged in the center part of this frame structure. Also, support bars 12 which are linked to corners of the die pad 10 to extend outward are formed at the four corners of the die pad 10. The support bars 12 are linked to the outer frames 8 respectively.

In this manner, it is in a state that the die pad 10 is linked to the outer frames 8 by the support bars 12 and is supported by them.

Also, a plurality of inner leads 16 are formed on the outside of the die pad 10 to extend outward in a state that these inner leads 16 are separated from the die pad 10. A plurality of inner leads 16 are coupled together by a dam bar 18, and outer leads 20 each extended outward are formed to be linked to the inner leads 16 respectively. The dam bars 18 are linked to the outer frame 8 and are supported by them. The outer leads 20 are linked to the inner frame 9 and are supported by them.

In this way, the inner leads 16 are supported by the outer frames 8 and the inner frames 9 via the dam bars 18 and the outer leads 20.

Figure 1B:
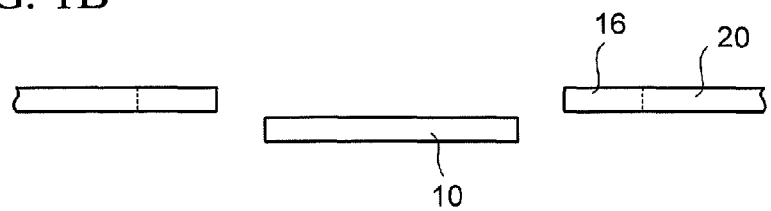

The support bars 12 which couple the die pad 10 and the outer frames 8 are bent and inclined at the coupling parts with the die pad 10. By this matter, as depicted in FIG. 1B, the die pad 10 is arranged in the position that is lower than the inner leads 16 and the outer leads 20. FIG. 1B is a sectional view taken along A-A' in FIG. 1A.

The lead frame member 1x in FIG. 1A is manufactured by punching out a metal plate such as a copper (Cu) alloy plate, or the like by means of the stamping using the die. Otherwise, the lead frame member 1x also can be manufactured by patterning a metal plate by means of the photolithography and the wet etching.

A thickness of the lead frame member 1x is set in the range from 0.125 mm to 0.25 mm, for example.

In FIG. 2 to FIG. 5C referred to hereunder, the explanation will be done to depict the die pad 10 of the lead frame member 1x in a fragmental fashion.

Figure 2:
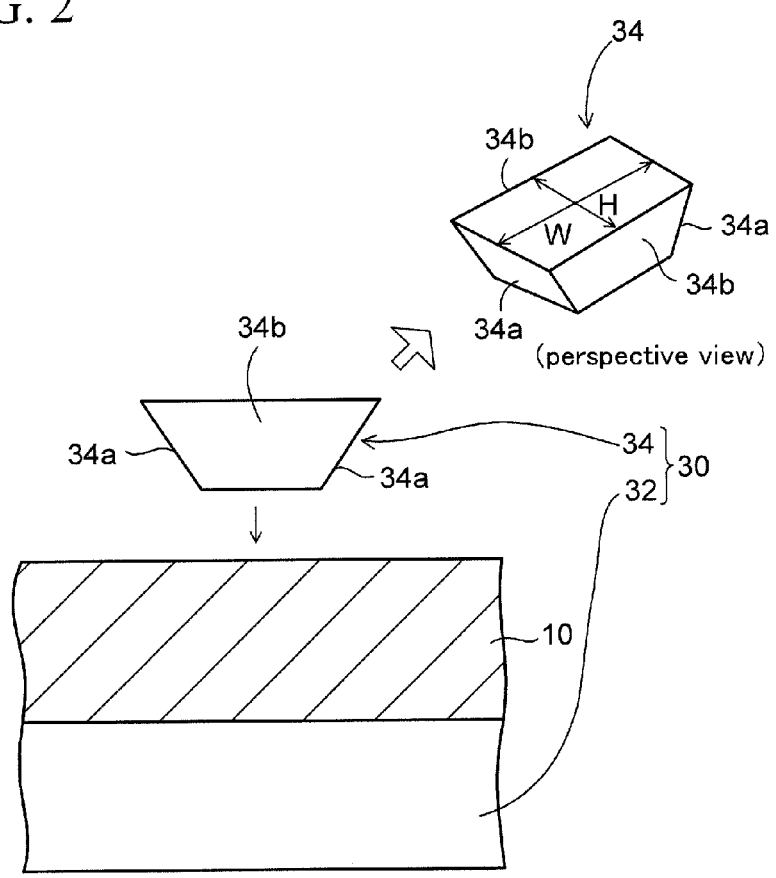
FIG. 2 is a sectional view and a perspective view (#2) depicting the method of manufacturing the lead frame according to the first embodiment.

As depicted in FIG. 2, a die 30 including of a supporting member 32 and first punches 34 is prepared. By reference to a perspective view of FIG. 2 together, a shape of the first punch 34 of the die 30 corresponds to a shape which is obtained by putting a trapezoid pillar to the horizontal direction. A surface of the trapezoid pillar on both sides in the width direction W is formed as an inclined side surface 34a that is inclined inward, whereas a surface of the trapezoid pillar on both sides in the height direction H is formed as an standing side surface 34b.

Then, the die pad 10 is arranged on the supporting member 32 of the die 30 in a state that the front side and the backside of the lead frame member 1x in FIG. 1A are reversed to direct the backside of the die pad 10 upward. Then, the backside of the die pad 10 is pressed downward by the first punch 34, thus the first stamping is performed.

Figure 3A:
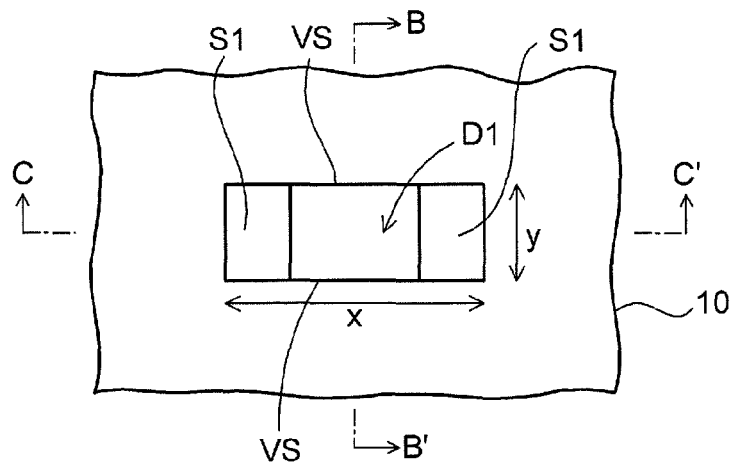
FIGS. 3A to 3C are a plan view and sectional views (#3) depicting the method of manufacturing the lead frame according to the first embodiment.

By this matter, as depicted in a plan view of FIG. 3A, a first dimple D1 having the shape corresponding to the shape of the first punch 34 is formed on the backside of the die pad 10. The first dimple D1 is formed in a rectangular shape when viewing with the planer view. Also, the first dimple D1 is formed as the concave portion corresponding to the shape which is obtained by putting the trapezoid pillar to the horizontal direction.

Figure 3B:
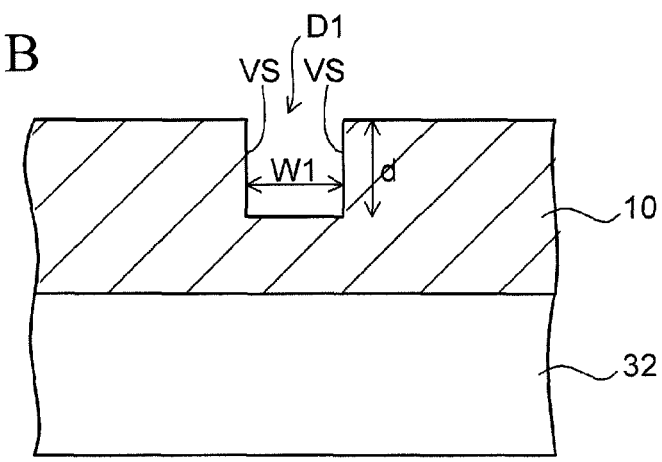

FIG. 3B is a sectional view taken along B-B' in FIG. 3A. By reference to FIG. 3B together, the first dimple D1 is formed to include standing side surfaces VS which stand upright in the depth direction, so as to correspond to the standing side surfaces 34b of the first punch 34, in the two opposing sides in the width direction.

The standing side surfaces VS are provided upright such that a width W1 in the width direction is kept substantially identical from the deep part side to the surface side of the first dimple D1. It is preferable that the standing side surfaces VS of the first dimple D1 is formed as the vertical surfaces. But the standing side surfaces VS may be formed to incline in some degree.

Figure 3C:
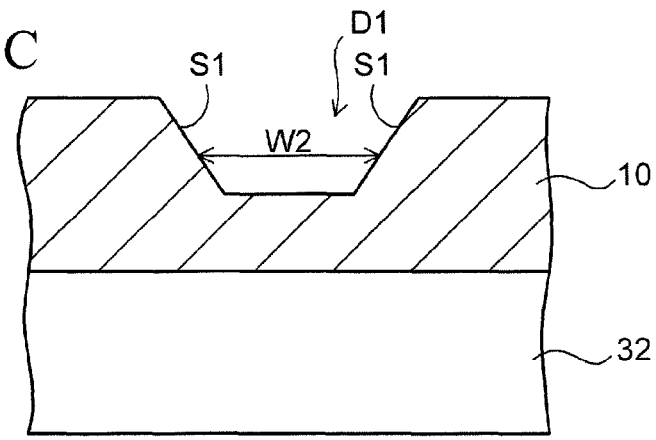

FIG. 3C is a sectional view taken along C-C' in FIG. 3A. By reference to FIG. 3C together, the first dimple D1 is formed to include first inclined side surfaces S1 which are inclined to the depth direction, so as to correspond to the inclined side surfaces 34a of the first punch 34, in the two opposing sides in the longer direction. The first inclined side surfaces S1 are arranged to be inclined such that a width W2 in the longer direction is made wider as it is positioned from the deep part side to the surface side of the first dimple D1.

In this manner, the first dimple D1 is formed to include the first inclined side surfaces S1 which are inclined to the depth direction, in the two opposing sides in one direction, and also include the standing side surfaces VS which stand upright in the depth direction, in the two opposing sides in the other direction.

In the rectangular first dimple D1 in FIG. 3A, the direction obtained by connecting two opposing first inclined side surfaces S1 is defined as the longer direction, and the direction obtained by connecting two opposing standing side surfaces VS is defined as the width direction.

For example, in FIG. 3A, a length x of the first dimple D1 in the longer direction is about 90 μm, and a width y of the first dimple D1 is about 50 μm. In FIG. 3B, a depth d of the first dimple D1 is about 25 μm.

Here, in the example in FIG. 3A, as the shape of the first dimple D1, a rectangular shape is used when viewing with the planer view. But a square shape may also be used when viewing with the planer view.

Then, as depicted in FIG. 4, second punches 36 of the die 30 are prepared. By reference to a perspective view of FIG. 4 together, the second punch 36 corresponds to a shape that a quadrangular pyramid is reversed up and down, and includes four inclined side surfaces 36a on the lower surface side. Then, in the backside of the die pad 10, the side areas of the standing side surfaces VS of the first dimple D1 are pressed downward by the second punches 36, thus the second stamping is performed.

By this matter, as depicted in a plan view of FIG. 5A, in the backside of the die pad 10, a second dimple D2 is formed in the side areas of the standing side surfaces VS (FIG. 4) on both sides of the first dimple D1 in the width direction respectively. the second dimple D2 includes second inclined side surfaces S2 corresponding to the inclined side surface 36a of the second punch 36, and is formed as the concave portion corresponding to the shape that a quadrangular pyramid is reversed up and down. An opening dimension of the second dimple D2 is formed like 50 μm☐, for example.

FIG. 5B is a sectional view taken along D-D' in FIG. 5A. By reference to FIG. 5B together, the standing side surfaces VS (FIG. 4) of the first dimple D1 are pushed to the inside of the first dimple D1 and are deformed, when the second inclined side surfaces S2 of the second dimple D2 are formed. Thereby, reversed inclined side surfaces Sx each inclined to the reversed direction to the first inclined side surface S1 are formed.

When the second dimples D2 are formed, the standing side surfaces VS (FIG. 4) of the first dimple D1 are largely pushed to the inside by the inclined side surfaces 36a of the second punch 36 as it is positioned from the deep part side to the surface side. Thus, the standing side surfaces VS of the first dimple D1 are transformed into the reversed inclined side surfaces Sx.

FIG. 5C is a sectional view taken along E-E' in FIG. 5A. By reference to FIG. 5C together, the second dimple D2 is formed on both sides in the width direction of the first dimple D1 respectively. Therefore, the first inclined side surfaces S1 in the longer direction of the first dimple D1 are not deformed, and are left without change.

In this way, the second dimples D2 are formed on the backside of the die pad 10 such that the second inclined side surface S2 of the second dimple D2 is arranged in the side areas of the standing side surfaces VS of the first dimple D1 respectively. By this matter, the standing side surfaces VS of the first dimple D1 can be deformed easily into the reversed inclined side surface Sx which is inclined to the reversed direction to the first inclined side surfaces S1.

With the above, the first dimple D1 has the shape in which the width W1 of the surface side is narrower than the width W2 of the deep part side. As a result, when the die pad 10 is sealed with a sealing resin, the large anchor effect can be obtained.

As in the example in FIG. 5A, a part of the standing side surfaces VS of the first dimple D1 may be transformed into the reversed inclined side surfaces Sx, otherwise the whole area of the standing side surface VS may be transformed into the reversed inclined side surface Sx.

Also, like the example in FIG. 5A, in the case that respective center parts of the standing side surfaces VS of the first dimple D1 are transformed into the reversed inclined side surfaces Sx, it is in a state that the standing side surface VS remains on both end part sides of the first inclined side surface S1 on both sides. In this event, this state is advantageous in the viewpoint that an injection port of the resin can be ensured widely at the time when the sealing resin is filled into the first dimple D1.

Also, any shape of the second dimple D2 can be employed if the standing side surfaces VS of the first dimple D1 can be formed as the reversed inclined side surfaces Sx. Thus, various shapes of the second dimple D2 can be employed. As the modes mentioned above, it is preferable that the second dimple D2 having the second inclined side surfaces S2 should be formed.

On the basis of the stamping mentioned above, as depicted in FIG. 6, first, a large number of first dimples D1 are formed on the whole backside of the die pad 10. Then, the second dimple D2 is formed on the die pad 10 in the side areas out of the first dimples D1 respectively, and thus the reversed inclined side surfaces Sx are formed in respective first dimples D1.

By this matter, a lead frame 1 according to the first embodiment is obtained. As depicted in FIG. 5A and FIG. 6, in the lead frame 1 of the first embodiment, the first dimples D1 having the rectangular shape are formed on the backside of the die pad 10.

The first dimple D1 includes the first inclined side surfaces S1 which are inclined to the depth direction, in the two opposing sides in one direction, and includes the reversed inclined side surfaces Sx which are inclined to the depth direction in the reversed direction to the first inclined side surfaces S1, in the two opposing sides in the other direction.

Further, the second dimples D2 are formed on the die pad 10 in the side areas of the first dimples D1. The second dimple D2 includes the second inclined side surfaces S2 which are inclined to the depth direction, and the second inclined side surfaces S2 are arranged to oppose to the reversed inclined side surfaces Sx of the first dimple D1. Then, the surface of the die pad 10 functions as the semiconductor element mounting surface.

When paying attention to arrangement angles of the first dimples D1 in FIG. 6, the first dimples D1 arranged in respective A parts are arranged to direct obliquely the upper right such that their longer direction is inclined to the lateral direction H at 45°. In contrast, the first dimples D1 arranged in respective B parts are arranged to direct obliquely the upper left such that their longer direction is inclined to the lateral direction H at 45°.

In this manner, the adjacent first dimples D1 are arranged such that their inclined directions are displaced by 90° mutually and that their longer directions intersect orthogonally with each other.

In the present embodiment, the first and second dimples D1, D2 are formed by engraving the die pad 10 by means of the stamping. Therefore, in the case that particularly the area that the stamping is performed is large, in some cases distortion occurs in the die pad 10 and thus the die pad 10 is warped.

As depicted in FIG. 6, by setting the arrangement angles to shift by 90° between the adjacent first dimples D1, the distortion caused at the time of stamping can be cancelled. As a result, occurrence of the warping of the die pad 10 can be decreased.

In FIG. 6, as the preferred example, the first dimples D1 are arranged such that the arrangement directions of respective first dimples D1 are inclined from the lateral direction H at 45° and that the arrangement directions of the adjacent first dimples D1 intersect orthogonally with each other. In fact, the first dimples D1 may be arranged such that their arrangement angles are different among a plurality of first dimples D1.

Figure 7:
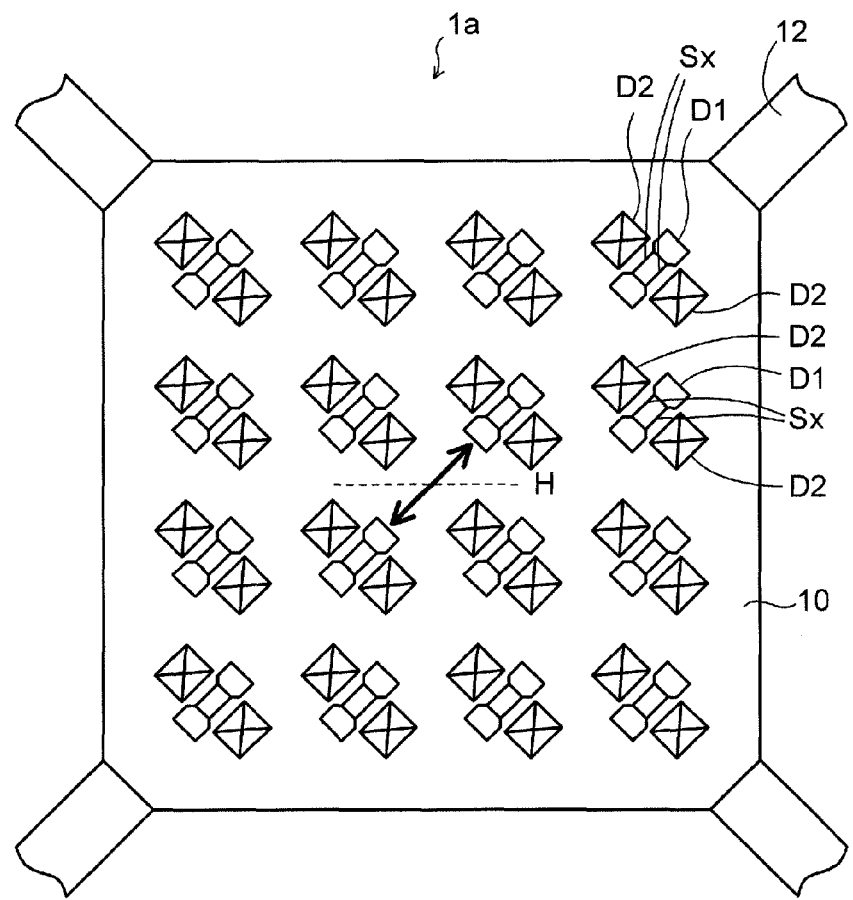
FIG. 7 is a plan view depicting a lead frame according to a variation of the first embodiment.

In FIG. 7, a lead frame 1a according to a variation of the first embodiment is depicted. Like the lead frame 1a of the variation in FIG. 7, in the case that the occurrence of the warping of the die pad 10 due to the stamping does not becomes the problem, the first dimples D1 may be arranged to direct their longer directions in the same direction.

In the example in FIG. 7, all first dimples D1 are arranged such that their longer directions are inclined to the lateral direction H at 45° to direct obliquely the upper right. In the lead frame 1a of the variation, the arrangement direction of the first dimples D1 can be arranged in any directions if the arrangement directions in the longer direction of all first dimples D1 are directed in the same direction.

Next, a method of manufacturing a semiconductor device by using the lead frame 1 in FIG. 6 of the first embodiment will be explained hereunder.

Figure 8A:
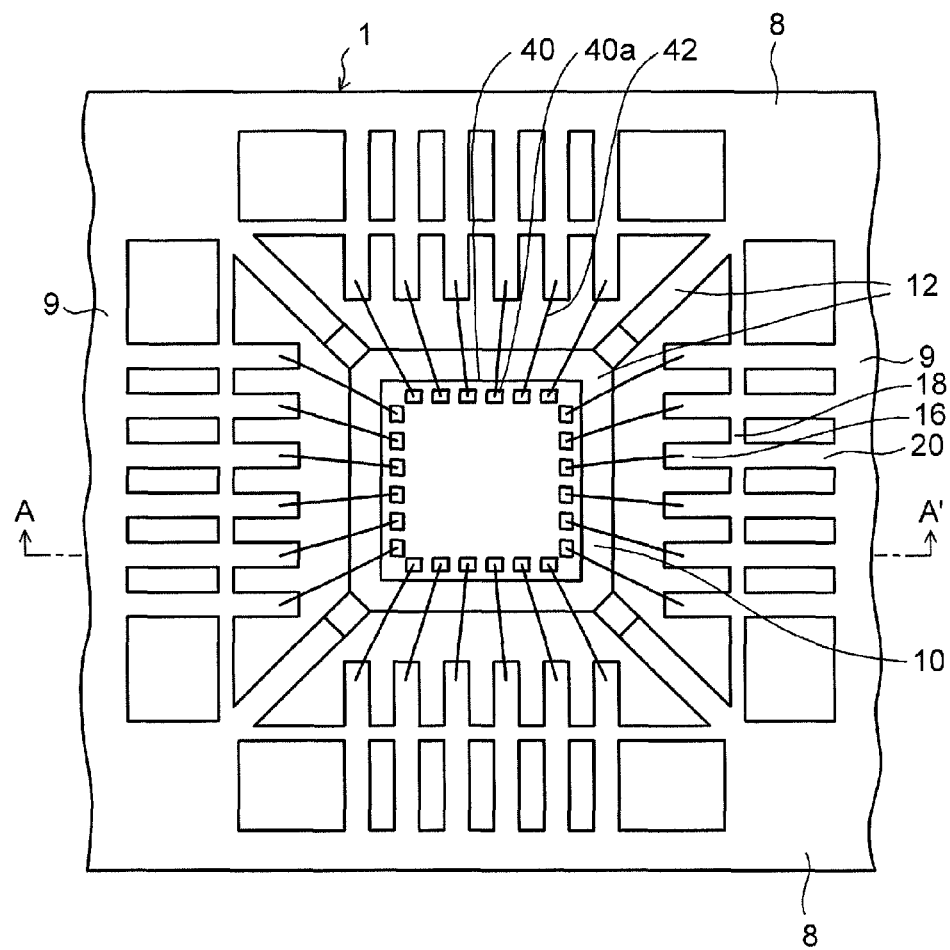
FIGS. 8A and 8B are a plan view and a sectional view (#1) depicting a method of manufacturing a semiconductor device by using the lead frame in FIG. 6.
Figure 8B:
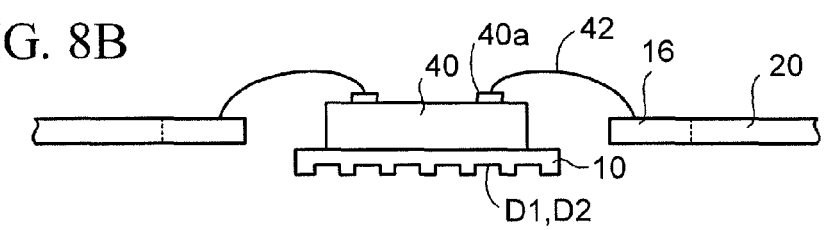

As depicted in FIGS. 8A and 8B, like FIG. 6 mentioned above, first, the lead frame 1 in which the first and second dimples D1, D2 are formed on the backside of the die pad 10 is prepared.

In the lead frame 1, the opposite face (front side) to the face on which the first and second dimples D1, D2 are formed functions as the semiconductor element mounting surface. Then, a semiconductor element 40 is fixed onto the component mounting surface of the die pad 10 by an adhesive agent so as to direct connection electrodes 40a of the semiconductor element 40 upward, and is mounted thereon.

Then, the connection electrodes 40a of the semiconductor element 40 and the inner leads 16 are connected with the wire 42 by the wire bonding respectively. FIG. 8B corresponds to a sectional view taken along A-A' of FIG. 8A.

Figure 9A:
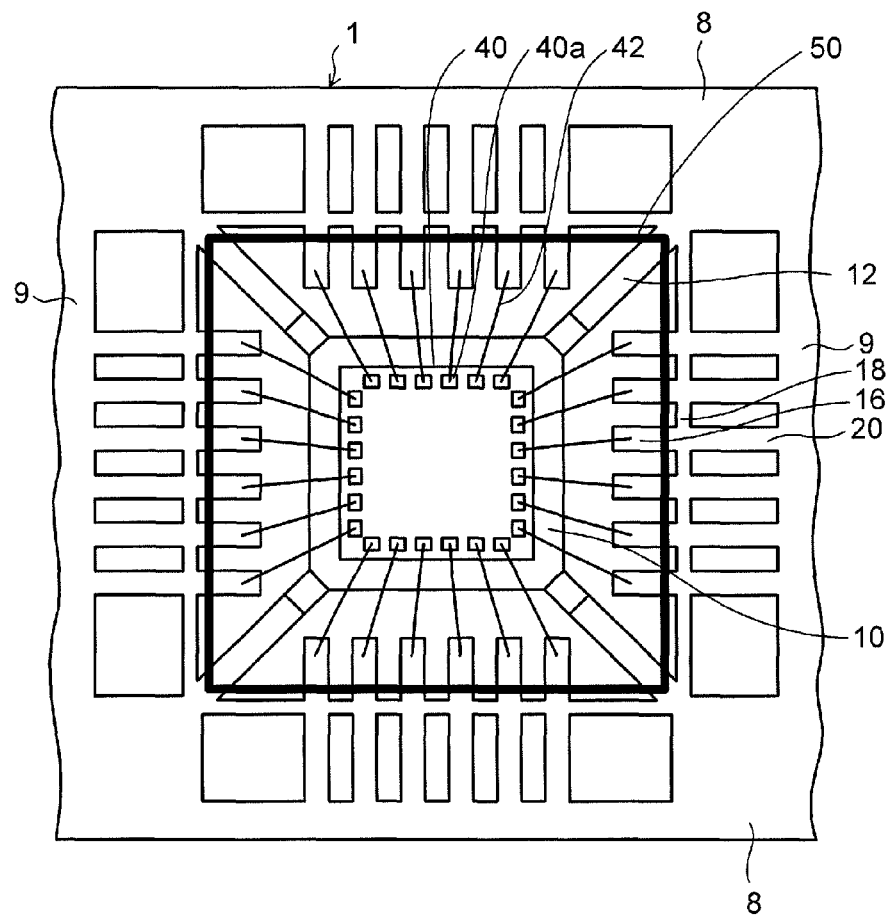
FIGS. 9A and 9B are a plan view and a sectional view (#2) depicting the method of manufacturing the semiconductor device by using the lead frame in FIG. 6.

Then, as depicted in FIG. 9A, the lead frame 1 on which the semiconductor element 40 is mounted is put between a lower mold and an upper mold of the molding machine (not shown). Then, the sealing resin is injected into the molding machine through the mold gate portion. By this matter, a resin portion 50 which seals both surfaces of the die pad 10, the semiconductor element 40, the wires 42, and the inner leads 16 is formed.

In FIG. 9A, the resin portion 50 is depicted in a perspective view, and is formed in a square area which is encircled with a thick line. The resin portion 50 is formed such that the dam bars 18 and the outer leads 20 are exposed to the outside of this resin portion 50.

Figure 9B:
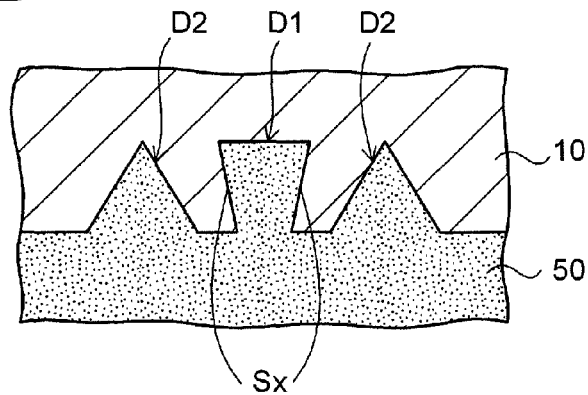

FIG. 9B corresponds to an enlarged sectional view depicting a state of the backside of the die pad 10 in FIG. 9A. As depicted in FIG. 9B, in the lead frame 1 of the first embodiment, as described above, the first dimple D1 provided on the backside of the die pad 10 includes the reversed inclined side surfaces Sx. By this matter, the resin portion 50 is filled such that this resin portion 50 cuts into the sidewalls along the reversed inclined side surfaces Sx of the first dimple D1.

In this way, the resin portion 50 is fixed so as not to come out of the first dimple D1. As a result, the anchor effect can be enhanced, and the resin portion 50 can be formed on the backside of the die pad 10 with good adhesion.

Also, in the lead frame 1 in FIG. 6 of the first embodiment, the side surfaces in the longer direction of the first dimple D1 are formed as the first inclined side surfaces S1 (FIGS. 5A and 5C) having a forward tapered shape. Therefore, when both surface sides of the die pad 10 are sealed with the resin portion 50, the sealing resin can be injected smoothly into the first dimple D1 by injecting the sealing resin from the same direction as the longer direction of the first dimple D1.

In the lead frame in FIG. 6, the adjacent first dimples D1 are arranged such that their longer directions intersect orthogonally mutually, and thus their inclined directions are displaced by 90°. In this event, the sealing resin tends to sneak around into the edge parts in the molding machine, and then flow into the inner part in the molding machine. Therefore, also in the first dimples D1 which are arranged to displace by 90°, it is possible to inject the sealing resin smoothly from the first inclined side surfaces S1.

As described above, in the lead frame in FIG. 6, the arrangement directions are altered among a plurality of first dimples D1 having the longer shape. Therefore, occurrence of the warping of the die pad 10 at the time of stamping can be decreased.

In addition to the above, the first dimple D1 includes the first inclined side surfaces S1 for making the injection of the sealing resin smooth, and the reversed inclined side surfaces Sx for increasing the anchor effect. By this matter, the sealing resin can be filled stably into the first dimples D1 with good reliability. Therefore, the sufficient anchor effect can be obtained, and adhesion of the resin portion 50 can be improved.

Then, the outer frames 8 and the inner frames 9 are separated from the lead frame 1, and also the dam bars 18 are cut off. Thus, a plurality of separated inner leads 16 and outer leads 20 are obtained.

Figure 10:
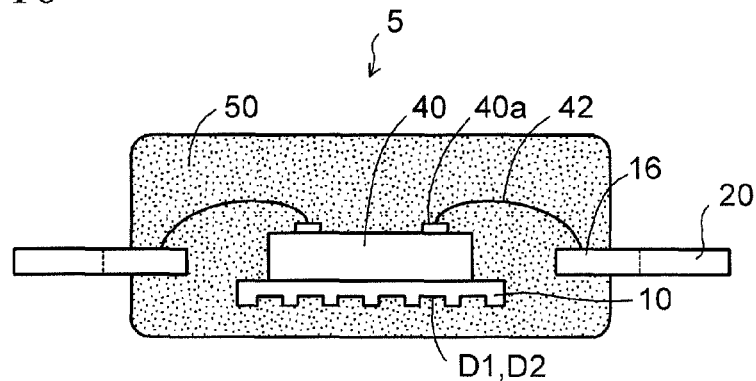
FIG. 10 is a sectional view depicting a semiconductor device according to the first embodiment.

With the above, as depicted in FIG. 10, a semiconductor device 5 according to the first embodiment is obtained.

As depicted in FIG. 10, the semiconductor device 5 of the first embodiment includes the die pad 10, the inner leads 16 and the outer leads 20, all being obtained from the lead frame 1 in FIG. 6. The semiconductor element 40 is mounted on the die pad 10, and the connection electrodes 40a of the semiconductor element 40 are connected to the inner leads 16 via the wire 42 respectively. Also, both surfaces of the die pad 10, the semiconductor element 40, the wires 42, and the inner leads 16 are sealed with the resin portion 50.

In the semiconductor device 5 of the first embodiment, as described above, the first dimples D1 including the reversed inclined side surfaces Sx are provided on the backside of the die pad 10. Therefore, the anchor effect can be enhanced, and the adhesion of the resin portion 50 to the backside of the die pad 10 can be improved, and thus high reliability can be obtained.

(Second Embodiment)

Figure 13:
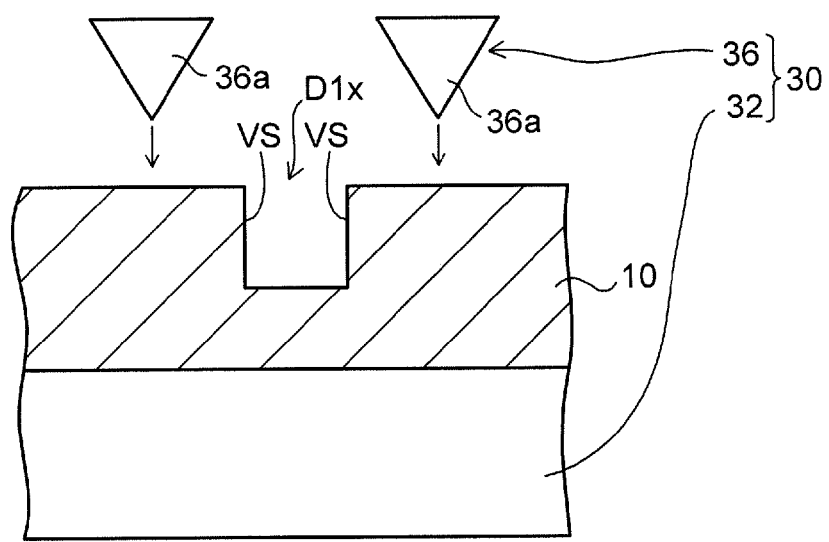
FIG. 13 is a sectional view (#3) depicting the method of manufacturing the lead frame according to the second embodiment.
Figure 14A:
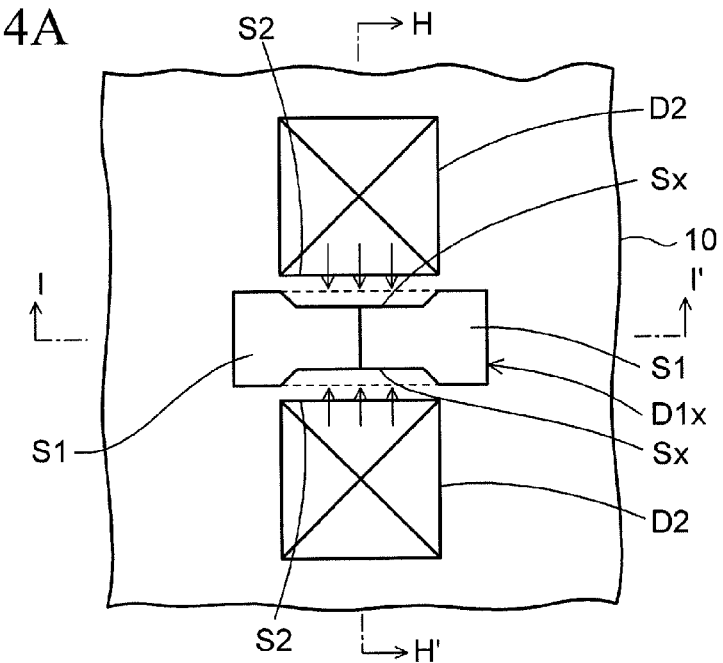
FIGS. 14A to 14C are a plan view and sectional views (#4) depicting the method of manufacturing the lead frame according to the second embodiment.
Figure 14B:
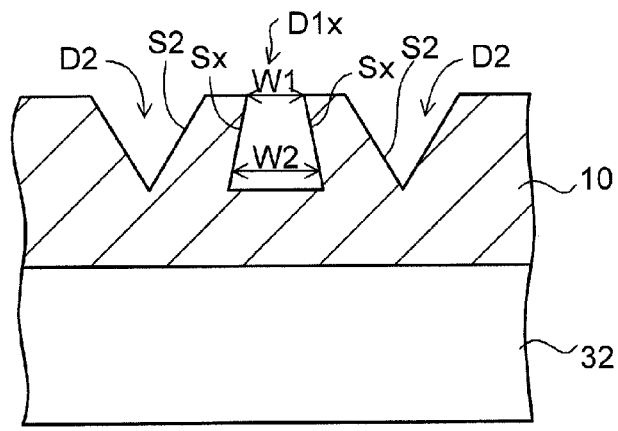
Figure 14C:
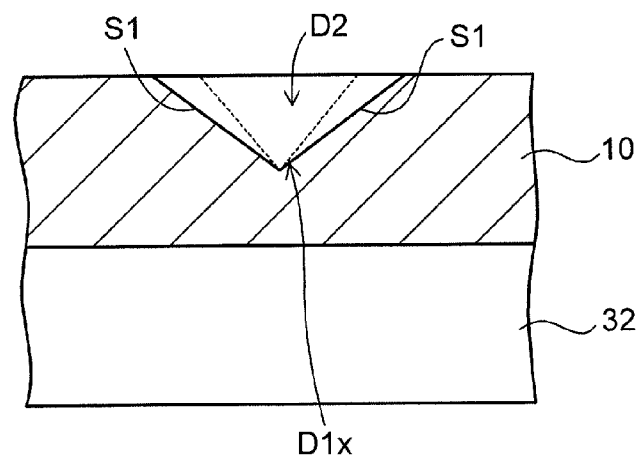
Figure 15:
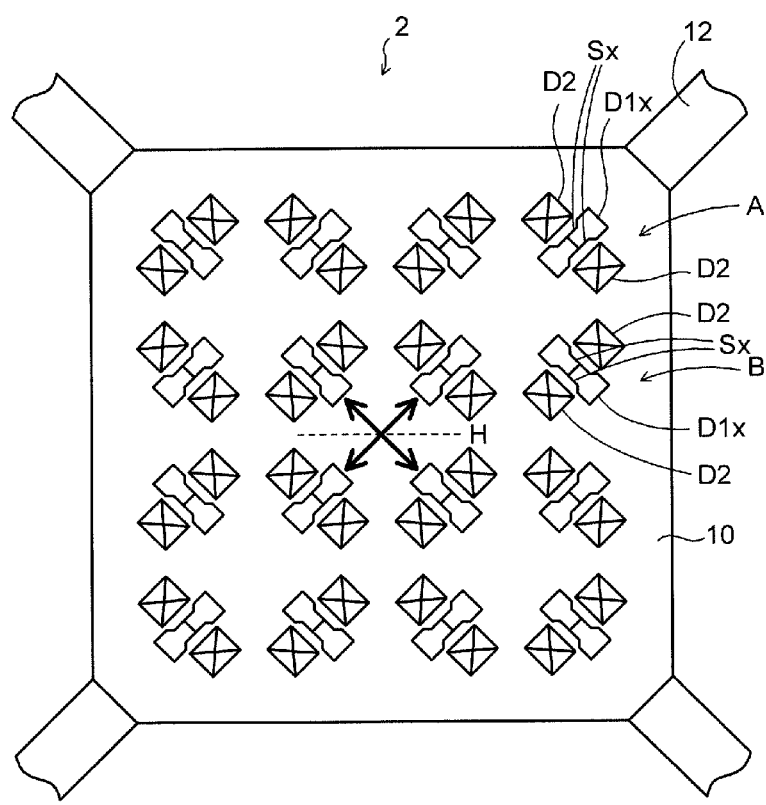
FIG. 15 is a plan view depicting a lead frame according to the second embodiment.

FIG. 11 to FIG. 14C are views depicting a method of manufacturing a lead frame according to a second embodiment, and FIG. 15 is a view depicting a lead frame according to the second embodiment. A difference of the second embodiment from the first embodiment is that a shape of the first dimple formed on the backside of the die pad is formed as a horizontal putting triangular pillar shape, instead of the horizontal putting trapezoidal pillar shape.

In the second embodiment, the same reference symbols are affixed to the same elements and the same steps as those in the first embodiment, and therefore their detailed explanation will be omitted hereunder.

Figure 11:
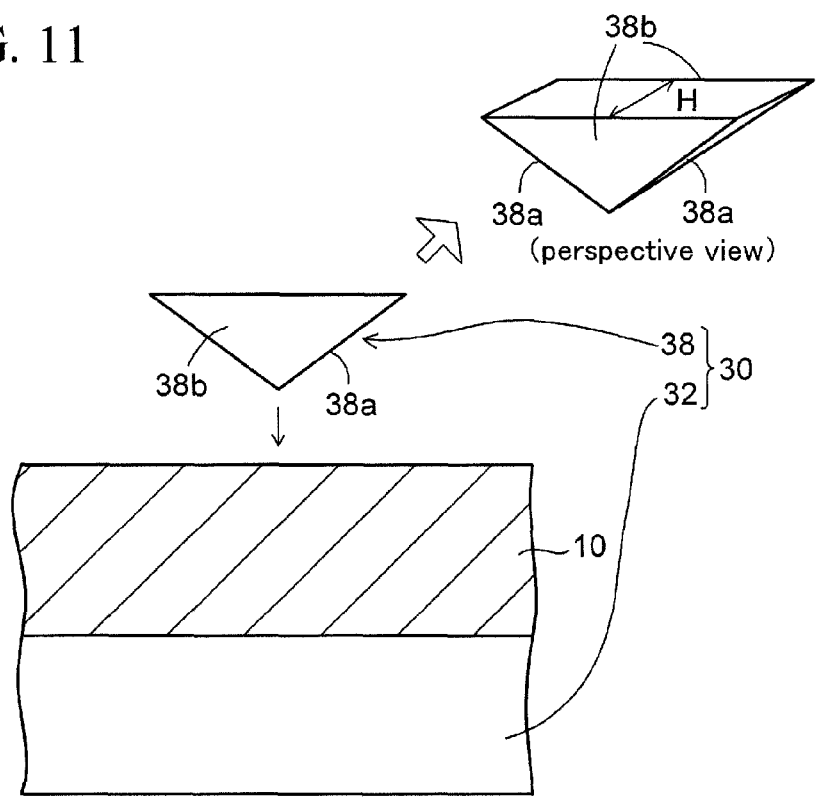
FIG. 11 is a sectional view and a perspective view (#1) depicting a method of manufacturing a lead frame according to a second embodiment.

In the method of manufacturing a lead frame according to a second embodiment, as depicted in FIG. 11, first, the die 30 including the supporting member 32 and third punches 38 is prepared. As depicted in a perspective view of FIG. 11, a shape of the third punch 38 of the die 30 corresponds to the shape obtained by putting a triangular pillar to horizontal direction.

In the third punch 38, two side surfaces of the triangular pillar are directed downward to constitute two inclined side surfaces 38a. Also, in the third punch 38, both surfaces in the height direction H of the triangular pillar constitute standing side surfaces 38b.

Also, like the first embodiment, the die pad 10 is arranged on the supporting member 32 of the die 30 in a state that the backside of the die pad 10 of the lead frame member 1x in FIG. 1A is directed upward. Subsequently, the backside of the die pad 10 is pressed downward by the third punch 38, thus the first stamping is performed.

Figure 12A:
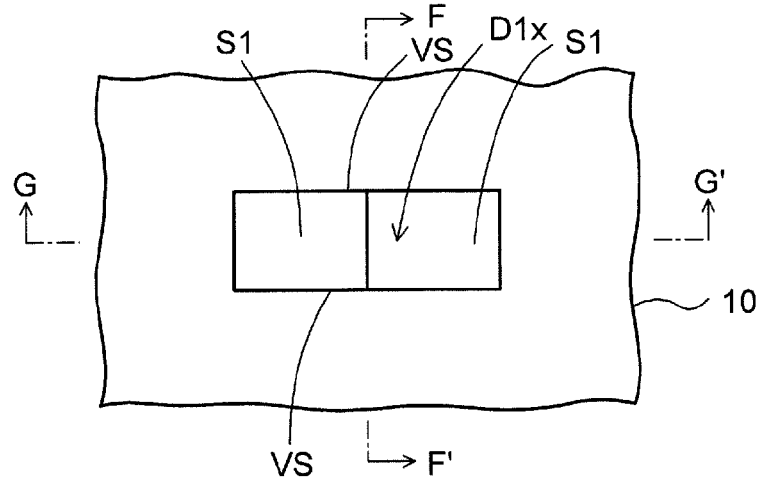
FIGS. 12A to 12C are a plan view and sectional views (#2) depicting the method of manufacturing the lead frame according to the second embodiment.

By this matter, as depicted in a plan view of FIG. 12A, a first dimple D1x corresponding to a shape of the third punch 38 is formed on the backside of the die pad 10. The first dimple D1x is formed as a rectangular shape when viewing with the planer view. Also, the first dimple D1x is formed as a concave portion corresponding to the shape which is obtained by putting a triangular pillar to the horizontal direction.

Figure 12B:
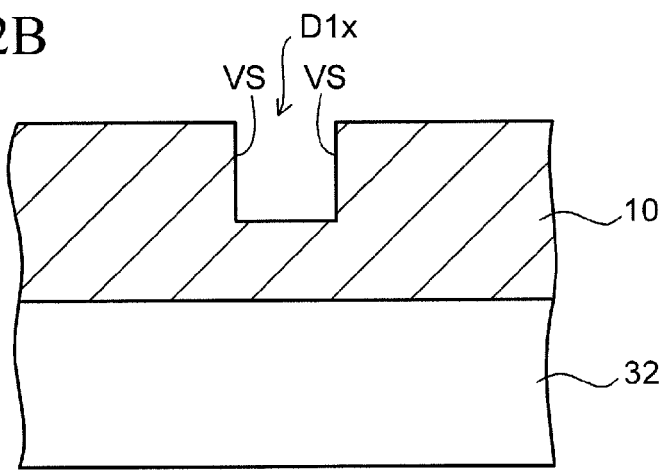

FIG. 12B corresponds to a sectional view taken along F-F' in FIG. 12A. By reference to FIG. 12B together, the first dimple D1x is formed to include the standing side surfaces VS corresponding to the standing side surfaces 38b of the third punch 38 respectively, in the two opposing sides in the width direction.

Figure 12C:
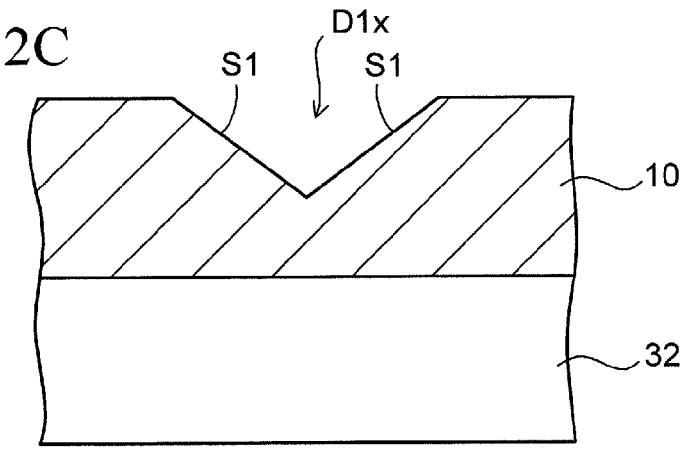

FIG. 12C corresponds to a sectional view taken along G-G' in FIG. 12A. By reference to FIG. 12C together, the first dimple D1x is formed to include the first inclined side surfaces S1 corresponding to the inclined side surfaces 38a of the third punch 38 respectively, in the two opposing sides in the longer direction.

In this manner, the first dimple D1x is formed to include the first inclined side surfaces S1 which are inclined to the depth direction, in the two opposing sides in one direction, and also include the standing side surfaces VS which are stand upright in the depth direction, in the two opposing sides in the other direction.

In the second embodiment, as the shape of the first dimple D1x, the square shape in the plan view may be employed in addition to the rectangular shape in the planer view.

Then, as depicted in FIG. 13, similar to the steps in FIG. 4 of the first embodiment, in the backside of the die pad 10, the side areas of the standing side surfaces VS in the first dimple D1x are pressed downward by the second punches 36 of the die 30, thus, the second stamping is performed.

By this matter, as depicted in a plan view of FIG. 14A, in the backside of the die pad 10, the second dimple D2 is formed in the side areas of the standing side surfaces VS (FIG. 13) on both sides of the first dimple D1x respectively. The second dimple D2 is formed as the concave portion having the shape that a quadrangular pyramid is reversed up and down, the concave portion corresponds to the shape of the second punches 36.

FIG. 14B corresponds to a sectional view taken along H-H' in FIG. 14A. By reference to FIG. 14B together, as in FIG. 5B of the first embodiment, when the second inclined side surfaces S2 of the second dimple D2 are formed, the standing side surfaces VS (FIG. 13) of the first dimple D1x are pushed to the inside of the first dimple D1x and are deformed at the moment. Thus, the reversed inclined side surfaces Sx are formed.

In this manner, like the first embodiment, the second dimples D2 are formed on the backside of the die pad 10 such that the second inclined side surface S2 of the second dimple D2 is arranged in the side areas of the standing side surfaces VS of the first dimple D1x respectively. By this matter, the standing side surfaces VS of the first dimple D1x can be easily transformed into the reversed inclined side surfaces Sx which are inclined to the reversed direction to the first inclined side surfaces S1.

With the above, like the first embodiment, the second dimple D2 is formed in the side areas in the width direction of the first dimple D1x, thereby the first dimple D1x is shaped such that the width W1 of the surface side is made narrower than the width W2 of the deep part side.

FIG. 14C corresponds to a sectional view taken along I-I' in FIG. 14A. By reference to FIG. 14C together, the second dimple D2 is formed on both sides in the width direction of the first dimple D1x. Therefore, the first inclined side surfaces S1 in the longer direction of the first dimple D1x are not deformed, and are left without change.

In this manner, like the first embodiment, the reversed inclined side surfaces Sx can be easily formed on a part of both side surfaces in the width direction of the first dimple D1x having the horizontal putting triangular pillar shape.

Like the first embodiment, as depicted in FIG. 15, on the basis of the above stamping method, a large number of first dimples D1x are formed on the whole backside of the die pad 10. Then, the second dimple D2 is formed on the die pad 10 in the side areas of respective first dimples D1x respectively, and thus the reversed inclined side surfaces Sx are formed to respective first dimples D1x.

By this matter, as depicted in FIG. 15, a lead frame 2 according to the second embodiment is obtained. As depicted in FIG. 14A and FIG. 15, in the lead frame 2 of the second embodiment, the rectangular first dimples D1x are formed on the backside of the die pad 10.

The first dimple D1x includes the first inclined side surfaces S1 which are inclined to the depth direction, in the two opposing sides in one direction, and also includes the reversed inclined side surfaces Sx which are inclined to the depth direction in the reversed direction to the first inclined side surfaces S1, in the two opposing sides in the other direction.

Further, the second dimple D2 is formed on the die pad 10 in the side areas of the first dimple D1x respectively. The second dimple D2 includes the second inclined side surfaces S2 which are inclined to the depth direction. The second inclined side surfaces S2 thereof are arranged to oppose to the reversed inclined side surfaces Sx of the first dimple D1x respectively. Then, the surface of the die pad 10 functions as a semiconductor element mounting surface.

In the lead frame 2 in FIG. 15, like the lead frame 1 in FIG. 6 of the first embodiment, the adjacent first dimples D1x are arranged such that their longer directions intersect orthogonally each other and that their inclined directions are displaced by 90° mutually.

The lead frame 2 of the second embodiment can achieve the similar advantages to those of the first embodiment.

Figure 16:
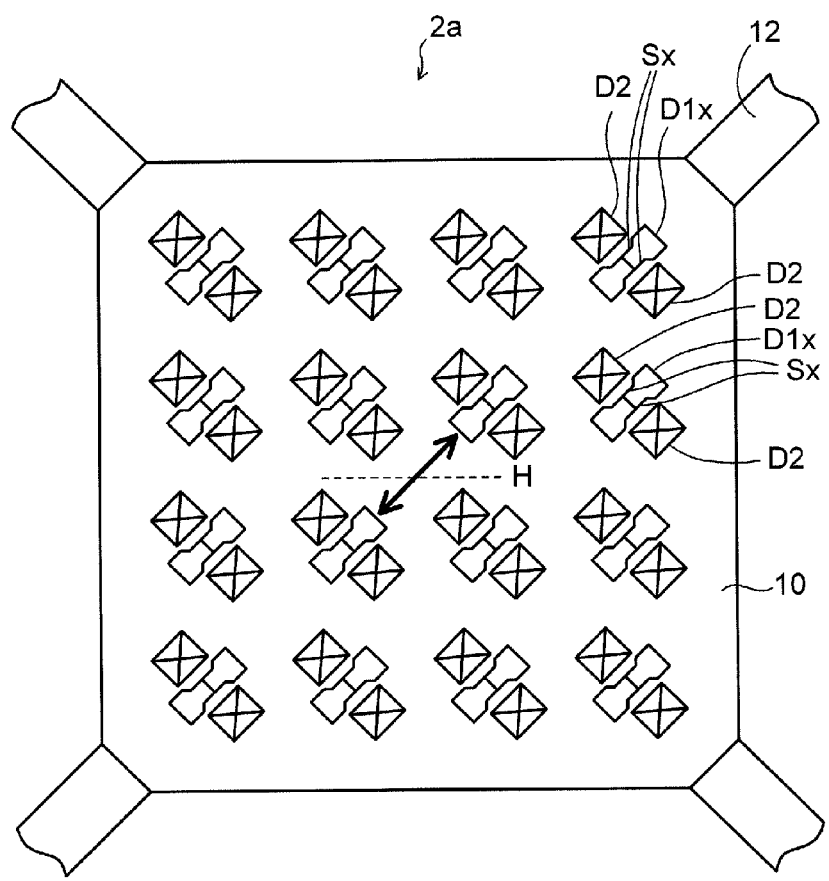
FIG. 16 is a plan view depicting a lead frame according to a variation of the second embodiment.

In FIG. 16, a lead frame 2a according to a variation of the second embodiment is depicted. As depicted in the lead frame 2a of the variation in FIG. 16, like FIG. 7 of the first embodiment, in the case that the occurrence of the warping due to the stamping does not become the problem, the longer directions of the first dimples D1x may be arranged in the same directions.

Also in the lead frames 2, 2a of the second embodiment, the similar semiconductor device can be manufactured by performing the steps explained in FIG. 8A to FIG. 9B of the first embodiment.

All examples and conditional language recited herein are intended for pedagogical Purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. A method of manufacturing a lead frame, comprising:
  forming a rectangular first dimple includes:
    first inclined side surfaces inclined to a depth direction, and arranged in two opposing sides in one direction; and
    standing side surfaces standing upright to a depth direction, and arranged in two opposing sides in other direction, on a backside of a die pad by a first stamping; and
  forming a second dimple including second inclined side surfaces inclined to a depth direction on the backside of the die pad by a second stamping, such that the second inclined side surfaces of the second dimple are arranged in side areas of the standing side surfaces of the first dimple,
  wherein in the forming a second dimple, the standing side surfaces of the first dimple are transformed into reversed inclined side surfaces inclined to a reversed direction to the first inclined side surfaces, and
  a front side of the die pad is semiconductor element mounting surface.

2. A method of manufacturing a lead frame, according to claim 1, wherein a shape of the first dimple is a horizontal putting trapezoid pillar shape or a horizontal putting triangular pillar shape, and a shape of the second dimple is a shape that a quadrangular pyramid is reversed up and down.

3. A method of manufacturing a lead frame, according to claim 2, wherein arrangement angles of a plurality of first dimples formed on the die pad are different, and the adjacent first dimples are arranged such that their longer directions intersect orthogonally each other, and the longer direction is a direction that the two opposing sides in the one direction face each other.

4. A method of manufacturing a lead frame, according to claim 1, wherein the reversed inclined side surfaces are formed by that a part of the standing side surfaces is deformed, and are formed in a center part of two opposing sides in the other direction.

5. A method of manufacturing a semiconductor device, comprising:
   obtaining a lead frame by a method that including
   forming a rectangular first dimple includes:
      first inclined side surfaces inclined to a depth direction, and arranged in two opposing sides in one direction and
      standing side surfaces standing upright to a depth direction, and arranged in two opposing sides in other direction, on a backside of a die pad by a first stamping; and
   forming a second dimple including second inclined side surfaces inclined to a depth direction on the backside of the die pad by a second stamping, such that the second inclined side surfaces of the second dimple are arranged in side areas of the standing side surfaces of the first dimple,
   wherein in the forming the second dimple, the standing side surfaces of the first dimple are transformed into reversed inclined side surfaces inclined to a reversed direction to the first inclined side surfaces;
   mounting a semiconductor element on a semiconductor element mounting surface on a front side of the die pad;
   connecting the semiconductor element and leads of the lead frame via a wire;
   sealing both surfaces of the die pad, the semiconductor element, and the wires with a resin portion to expose the leads; and
   separating the die pad and the leads from a frame portion of the lead frame.

6. A lead frame, comprising:
   a die pad;
   a rectangular first dimple formed on a backside of the die pad, including,
      first inclined side surfaces inclined to a depth direction, and arranged in two opposing sides in one direction, and
      reversed inclined side surfaces inclined to a depth direction of a reversed direction to the first inclined side surfaces, and arranged in two opposing sides in other direction; and
   a second dimple formed on the backside of the die pad in side areas of the first dimple, and including second inclined side surfaces inclined to a depth direction, and the second inclined side surfaces being arranged to oppose to the reversed inclined side surfaces of the first dimple;
   wherein a front side of the die pad is a semiconductor element mounting surface.

7. A lead frame according to claim 6, wherein a shape of the first dimple is a horizontal putting trapezoid pillar shape or a horizontal putting triangular pillar shape, and
   a shape of the second dimple is a shape that a quadrangular pyramid is reversed up and down.

8. A lead frame according to claim 7, wherein arrangement angles of a plurality of first dimples formed on the die pad are different, and the adjacent first dimples are arranged such that their longer directions intersect orthogonally each other, and
   the longer direction is a direction that the two opposing sides in the one direction face each other.

9. A lead frame according to claim 6, wherein the reversed inclined side surfaces of the first dimple are arranged in a part of two opposing sides in the other direction, and standing side surfaces are arranged in end part sides of two opposing sides in other direction.

10. A semiconductor device, comprising:
    a die pad;
    a rectangular first dimple formed on a backside of the die pad, including,
       first inclined side surfaces inclined to a depth direction, and arranged in two opposing sides in one direction, and
       reversed inclined side surfaces inclined to a depth direction of a reversed direction to the first inclined side surfaces, and arranged in two opposing sides in other direction; and
    a second dimple formed on the backside of the die pad in side areas of the first dimple, and including second inclined side surfaces inclined to a depth direction, and the second inclined side surfaces being arranged to oppose to the reversed inclined side surfaces of the first dimple;
    a semiconductor element mounted on a semiconductor element mounting surface on a front side of the die pad;
    a plurality of leads arranged to align to an outer side of the die pad;
    wires connecting the semiconductor element and the leads; and
    a resin portion sealing both surfaces of the die pad, the semiconductor element, and wires to expose the leads.

* * * * *